United States Patent
Vu et al.

(10) Patent No.: US 9,378,784 B1
(45) Date of Patent: Jun. 28, 2016

(54) SECURITY DEVICE USING HIGH LATENCY MEMORY TO IMPLEMENT HIGH UPDATE RATE STATISTICS FOR LARGE NUMBER OF EVENTS

(71) Applicant: Palo Alto Networks, Inc., Santa Clara, CA (US)

(72) Inventors: De Bao Vu, San Jose, CA (US); Gyanesh Saharia, Cupertino, CA (US)

(73) Assignee: Palo Alto Networks, Inc., Santa Clara, CA (US)

(*) Notice: Subject to any disclaimer, the term of this patent is extended or adjusted under 35 U.S.C. 154(b) by 238 days.

(21) Appl. No.: 13/748,493

(22) Filed: Jan. 23, 2013

(51) Int. Cl.
*G11C 7/10* (2006.01)
*H04L 12/861* (2013.01)
*G06F 5/10* (2006.01)

(52) U.S. Cl.
CPC .............. *G11C 7/1072* (2013.01); *G06F 5/10* (2013.01); *G11C 7/10* (2013.01); *H04L 49/9078* (2013.01)

(58) Field of Classification Search
CPC ....................................................... G11C 7/10
USPC ............................................................ 711/5
See application file for complete search history.

(56) References Cited

U.S. PATENT DOCUMENTS

| | | | |
|---|---|---|---|
| 6,701,447 B1 * | 3/2004 | Bass et al. ............... | 713/502 |
| 7,296,112 B1 * | 11/2007 | Yarlagadda ............ | G06F 12/06 711/105 |
| 8,209,458 B1 * | 6/2012 | Keren ................ | H04L 49/9078 370/395.1 |
| 2006/0133186 A1 * | 6/2006 | Hummler ............. | G11C 7/1018 365/230.06 |
| 2010/0082876 A1 * | 4/2010 | Lala ........................ | G06F 5/10 711/5 |
| 2011/0113190 A1 * | 5/2011 | Acharya ................ | H04L 69/12 711/108 |

OTHER PUBLICATIONS

Hoffmann, The ABC of SDRAM Memory Mar. 20, 2002 (PDF Attached).*
The ABC of SDRAM Memory, Mar. 2, 2002 (PDF Attached).*
Hoffman, "The ABC of SDRAM Memory", Mar. 2, 2002.*
Hoffmann, "The ABC of SDRAM Memory", Mar. 2, 2002.*

* cited by examiner

*Primary Examiner* — David X Yi
*Assistant Examiner* — Zubair Ahmed
(74) *Attorney, Agent, or Firm* — Van Pelt, Yi & James LLP

(57) ABSTRACT

A security device includes a controller configured to determine a flow identifier and an event counter associated with a received data packet and a counter memory including multiple memory banks where each memory bank stores a partial counter value for one or more event counters. The counter memory is indexed by a counter identifier associated with the event counter. A memory controller selects a memory bank in the counter memory that was not the memory bank last selected and the partial counter value associated with the counter identifier in the selected memory bank is updated, the updated partial counter value being written back to the selected memory bank. In one embodiment, the partial counter value is updated and written back within the latency window of the memory bank last selected.

21 Claims, 5 Drawing Sheets

SECURITY DEVICE USING HIGH LATENCY MEMORY TO IMPLEMENT HIGH UPDATE RATE STATISTICS FOR LARGE NUMBER OF EVENTS

BACKGROUND OF THE INVENTION

Devices such as firewalls are sometimes used to prevent users from accessing resources to which they are not authorized. As an example, members of the public may be entitled to access content served by a web server, but not authorized to access other services available on the server such as administrative tools. In another example, employees of a company may be entitled to access certain websites or certain class of websites while other websites or other classes of websites may be prohibited for all employees. Firewalls and other security devices typically enforce policies against network transmissions based on a set of rules.

To implement complex security policies, a firewall needs to keep track of many independent events and correlate the events for policy enforcement. Firewalls or other security devices typically maintain event statistics using counters which are updated rapidly to effectively examine network traffic as the traffic is being communicated.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
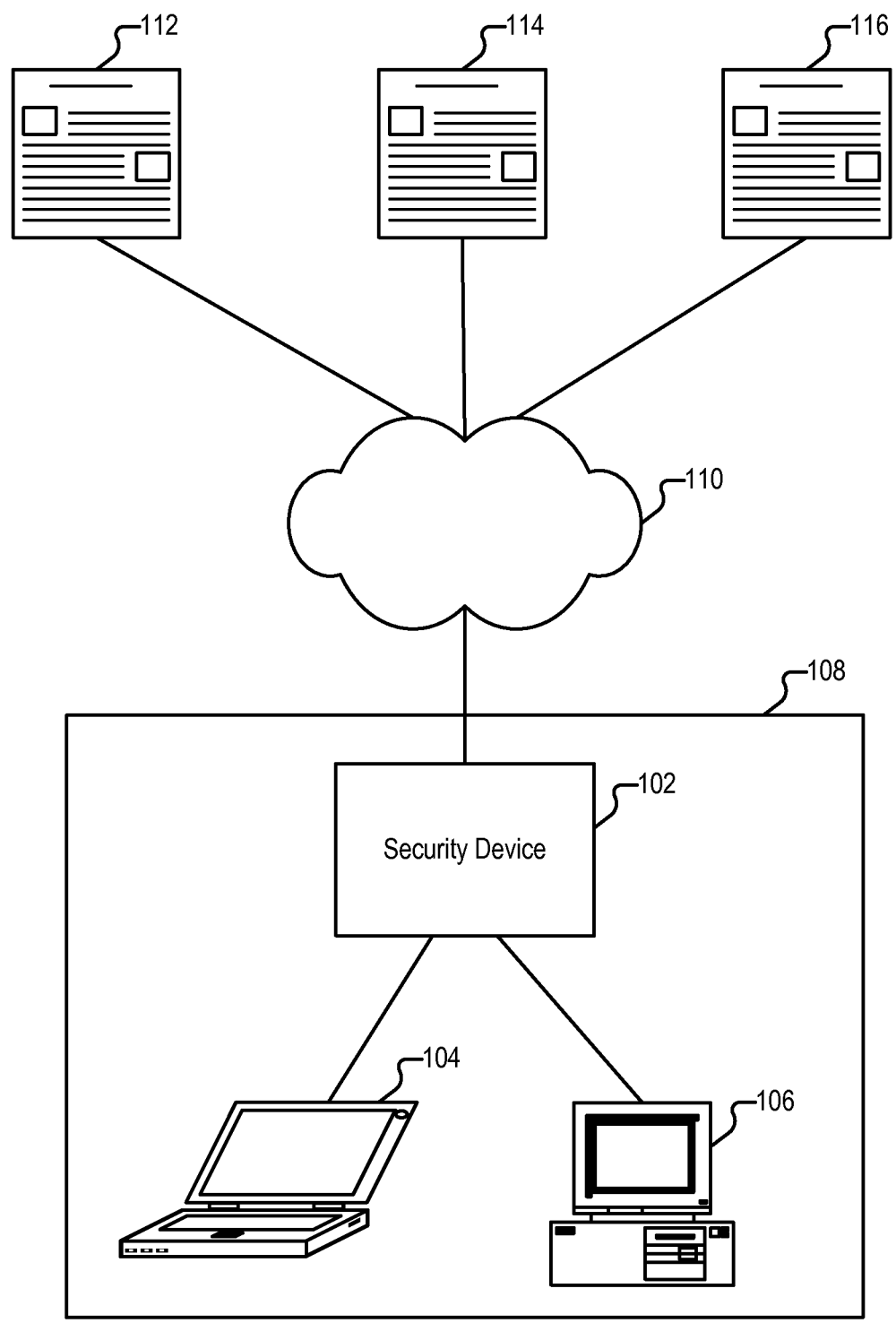
FIG. 1 illustrates an embodiment of an environment in which security policies are enforced.

FIG. 1 illustrates an embodiment of an environment in which security policies are enforced. In the example shown, clients 104 and 106 are a laptop computer and desktop computer, respectively, present in an enterprise network 108. Security device 102 (also referred to herein as "device 102") is configured to enforce policies regarding communications between clients, such as clients 104 and 106, and nodes outside of enterprise network 108, such as nodes reachable via external network 110. One example of a policy is a rule prohibiting any access to site 112 (a pornographic website) by any client inside network 108. Another example of a policy is a rule prohibiting access to social networking site 114 by clients between the hours of 9 am and 6 pm. Yet another example of a policy is a rule allowing access to streaming video website 116, subject to a bandwidth or other consumption constraint. Other types of policies can also be enforced, such as ones governing traffic shaping, quality of service, or routing with respect to URL information. In some embodiments, security device 102 is also configured to enforce policies with respect to traffic that stays within enterprise network 108.

In some embodiments, the security device 102 includes a security appliance, a security gateway, a security server, a firewall, and/or some other security device, which, for example, can be implemented using computing hardware, software, or various combinations thereof. The functionality provided by security device 102 can be implemented in a variety of ways. Specifically, security device 102 can be a dedicated device or set of devices. The functionality provided by device 102 can also be integrated into or executed as software on a general purpose computer, a computer server, a gateway, and/or a network/routing device. Further, whenever device 102 is described as performing a task, a single component, a subset of components, or all components of device 102 may cooperate to perform the task. Similarly, whenever a component of device 102 is described as performing a task, a subcomponent may perform the task and/or the component may perform the task in conjunction with other components. In various embodiments, portions of device 102 are provided by one or more third parties. Depending on factors such as the amount of computing resources available to device 102, various logical components and/or features of device 102 may be omitted and the techniques described herein adapted accordingly. Similarly, additional logical components/features can be added to system 102 as applicable.

Figure 2:
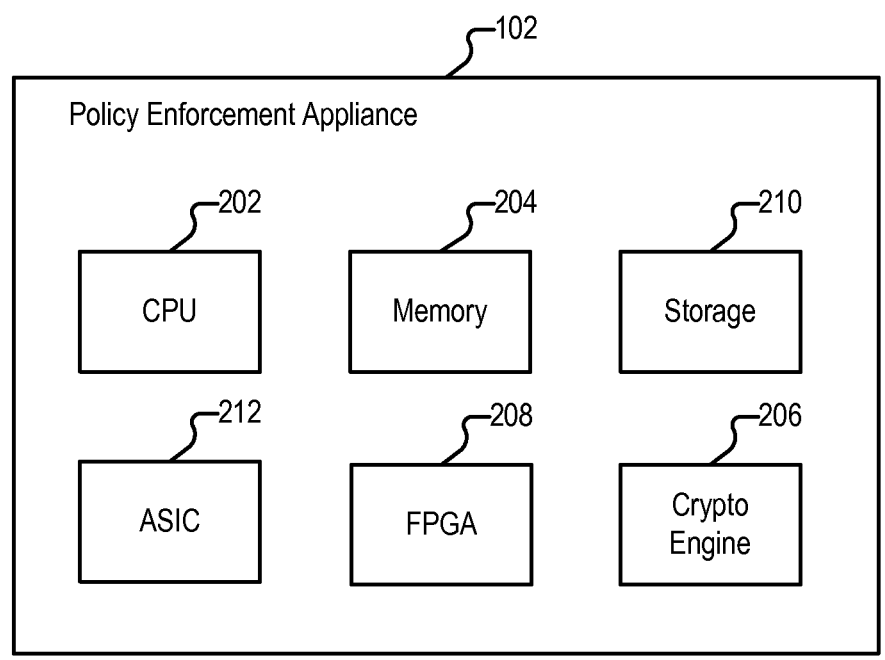
FIG. 2 illustrates an embodiment of a security device.

FIG. 2 illustrates an embodiment of a security device. The example shown is a representation of physical components that are included in device 102, in some embodiments. Specifically, device 102 includes a high performance multi-core CPU 202 and memory 204. Device 102 also includes a storage 210 (such as one or more hard disks), which is used to store policy and other configuration information. Security device 102 can also include one or more optional hardware accelerators. For example, device 102 can include a cryptographic engine 206 configured to perform encryption and decryption operations, and one or more FPGAs 208 or ASICs 212 configured to perform matching, act as network processors, and/or perform other tasks.

To implement complex security policies, security device 102 keeps track of large numbers of independent events and correlate the events for policy enforcement. To that end, security device 102 maintains event statistics using counters which are stored in memory 204. The event statistics or counters are updated rapidly to ensure that network traffic is examined effectively as the traffic is being communicated.

Figure 3:
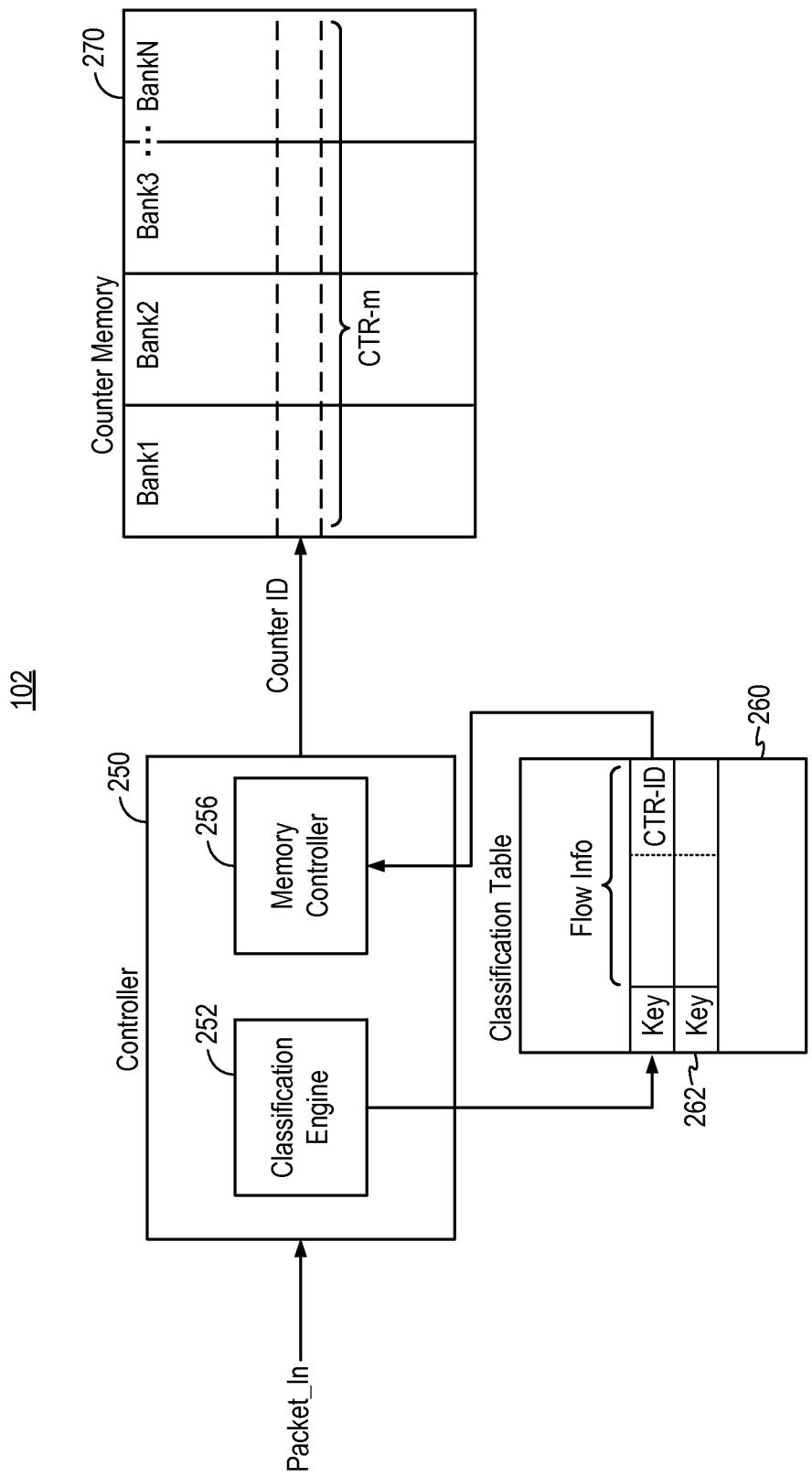
FIG. 3 illustrates an embodiment of a security device using a high latency memory device to implement event statistics counters according to embodiments of the present invention.

FIG. 3 illustrates an embodiment of a security device using a high latency memory device to implement event statistics counters according to embodiments of the present invention. In the example shown, the functionality of security device 102 is implemented in a firewall. Security device 102 includes a controller 250 communicating with a classification table 260. Security device 102 further includes a counter memory 270 which may include two or more memories or memory banks for storing event statistics in the form of counters. Security device 102 may include other components not shown in FIG. 3 to implement other functionalities of the security device, such as policy enforcement. The example shown in FIG. 3 illustrates primarily components of security device 102 associated with maintaining event statistics.

Controller 250 receives incoming data packets which can be communication from client devices (such as computers 104, 106) or from the external network (such as network 110). The received data packets are provided to a classification engine 252 to identify a "flow" associated with the received data packets. In embodiments of the present invention, a flow refers to a classification or identification of an application traversing the network. In some embodiments, a flow refers to a TCP/IP flow which includes a sequence of data packets communicating information between a source and a destination in one direction. In the present description, TCP/IP refers to the Internet protocol suite including the set of communications protocols used for the Internet and data networks. The Internet protocol suite includes IP (Internet Protocol), TCP (Transmission Control Protocol), UDP (User Datagram Protocol) or other protocols. Flow identity for a data packet is determined from information in the header of the data packet. In some embodiments, flow identity is determined from the 5-tuple information of the data packet, including the source IP address, destination IP address, the source port number, the destination port number and the protocol in use.

The classification engine 252 determines, among other things, whether a received data packet belongs to a known flow or to an unknown flow. The flow identity is used to locate a flow record 262 in the classification table 260 if the data packet belongs to a known flow. The flow identity is also used to create a new flow record in the classification table 260 if the data packet belongs to an unknown flow. Based on the flow information stored in the flow record 262, controller 250 performs network security functions and applies network security policies to the received data packets. Controller 250 may include modules (not shown) for forwarding the received data packets onward after processing for security functions.

Classification table 260 in security device 102 is implemented as a memory having stored thereon one or more flow records 262. Classification table 260 maintains a mapping of all active flows in the security device 102. Each flow record 262 in classification table 260 is indexed by an indexing key serving as the flow identifier (or "Flow ID") and each flow record stores flow information or attributes associated with a given flow. The key is used to identify and retrieve the flow record associated with a received data packet, based on the flow identity as determined from the header information of the data packet. In some embodiments, the key can be a hash key and classification table 260 can be implemented as a hash table. The flow information may contain one or more rules which can be used by modules of the security device 102 to further process the received data packets associated with a given flow. For example, the flow information may contain policy information (firewall policy or intrusion prevention system (IPS) policy) to apply to the flow or the received data packets. As a further example, flow information may contain information required by a session engine to decide whether a particular data packet should be allowed. In another example, flow information may contain rules to implement network policies regarding, for example, connection time out, time billing, and bandwidth usage. The flow information may further contain other information that is used by other modules of the security device, such as encryption parameters, address translation parameters, and bookkeeping information.

In order to implement complex security policies, security device 102 maintains event statistics to keep track of many independent events and correlate the events for policy enforcement. Event statistics may include statistics items such as the number of data packets or the number of data bytes associated with a flow. Security device 102 maintains event statistics in the form of event counters. Event counters are assigned a unique counter identifier (or "counter ID") and may be created and deleted. Counter values can be set to a given value, incremented, and decremented. Event counters are implemented in a counter memory 270 which stores counter values associated with each counter identifier.

Counter memory 270 needs to be capable of storing a large number of counters and sustaining a high memory update rate. For instance, the security device 102 may be keeping track of tens of millions of flows at any instant and thus counter memory 270 needs to have the capacity for storing tens of millions of counter values. Furthermore, because the incoming data packets are coming in at a high data rate, the counter memory 270 needs to be capable of being updated at a high update rate in order to keep the event statistics current and valid. That is, the write operation to the memory cells in the counter memory needs to be capable of occurring at a high rate to keep up with event statistics update. For example, security device 102 may be deployed in a network running at 100 Gbps and the security device may be receiving up to 150 Mpps (million packet per second). Thus, the counter memory 270 must be able to handle up to 150 million updates per second.

In the preset description, the "update rate" of a memory device (or the "memory update rate") refers to the speed at which a memory device updates or writes stored data. More specifically, the update rate refers to the rate at which a read-modify-write operation can occur to the same memory location. In some memory devices, a memory cell is updated by first reading the old data, then updating the old data with new data, and finally writing back the updated data to the same memory location. This is referred to as the read-modify-write operation and the time it takes to complete the operation is sometimes referred to as the "read-modify-write latency" In some cases, the time it takes to read or retrieve, update, and write back data to a memory cell in a memory device is refers to as the "memory latency" or "latency window".

In the counter memory, each time a data packet is received by the security device, the event counters need to be updated. The counter memory needs to retrieve the counter value for a given counter identifier, update the counter value and write back the updated counter value to the counter memory. The counter memory update must be completed before the next counter update is required. Thus, the memory latency of the counter memory must be shorter than the data rate of the incoming data packets to ensure that accurate event statistics can be maintained.

Counter memory 270 needs to be implemented using memory devices that can meet both the large capacity and the fast update requirements. However, memory devices capable of a fast update rate (low latency), such as SRAMs, are typically more expensive, have less capacity and are not scalable. On the other hand, memory devices that are low cost, have large capacity and are scalable, such as DRAMs, typically have slow update rate (high latency), not fast enough to keep up with the rate the event statistics needs to be updated in the security device. In order to keep up with the fast update rates required to maintain event statistics in a security device, expensive low latency memories are often used which increase the system cost for the security device.

In embodiments of the present invention, the counter memory 270 in security device 102 is implemented using a high latency memory device configured in multiple memory blocks to store partial counter values. The partial counter values in the memory blocks are updated alternately to realize an overall update rate that is faster than the native update rate of the memory device. In this manner, low cost, high latency memory devices can be used in a security device to implement the counter memory while enabling the security device to keep up with the high update rate required to maintain event statistics. In one embodiment, the counter memory is implemented using DRAMs which has large capacity, are low cost and are scalable. In particular, the counter memory may be implemented using a memory device having a memory latency per memory block longer than the data rate of the incoming data packets. However, by accessing alternate memory banks of the counter memory, the counter memory can achieve an overall update rate having a latency low enough to keep up with the data rate of the incoming data packets, as will be explained in more detail below.

Returning to FIG. 3, each time a data packet is received at controller 250, the data packet is parsed by the classification engine 252 and the flow associated with the received data packet, if any, is identified. The classification engine 252 retrieves the flow record stored in the classification table 260 for that flow. The flow record contains information identifying the event counters that need to be updated for that flow. For example, a counter identifier or counter ID (CTR-ID) may be part of the information stored in the flow information of a flow record. The counter ID in the flow record is retrieved and provided to a memory controller 256. The memory controller 256 uses the counter ID to index the counter memory 270 to update the value of the event counter identified by the counter ID.

In embodiments of the present invention, counter memory 270 is configured as N memory banks. The N memory banks can be logical partitions of a single memory device or the N memory banks can be implemented using physically separate memory devices. Each memory bank (Bank1, Bank2, Bank3 ... Bank N) stores partial value of the event counter identified by a counter identifier or a counter ID. In other words, each memory bank stores a fraction of or a part of the event counter value. The total value of the event counter (e.g. CTR-m) is obtained by summing the partial counter values across all the memory banks. In operation, the memory controller 256 implements a counter memory update method where the event counters are updated by rotating or alternating between different memory banks for each counter update. Thus, even though the counter memory is a high latency memory, the counter update can be carried out at a high update rate by not returning to the same memory bank but instead going to another memory bank for the next counter update. Thus, latency at a particular memory bank does not impact the overall update rate of the counter memory.

Figure 4:
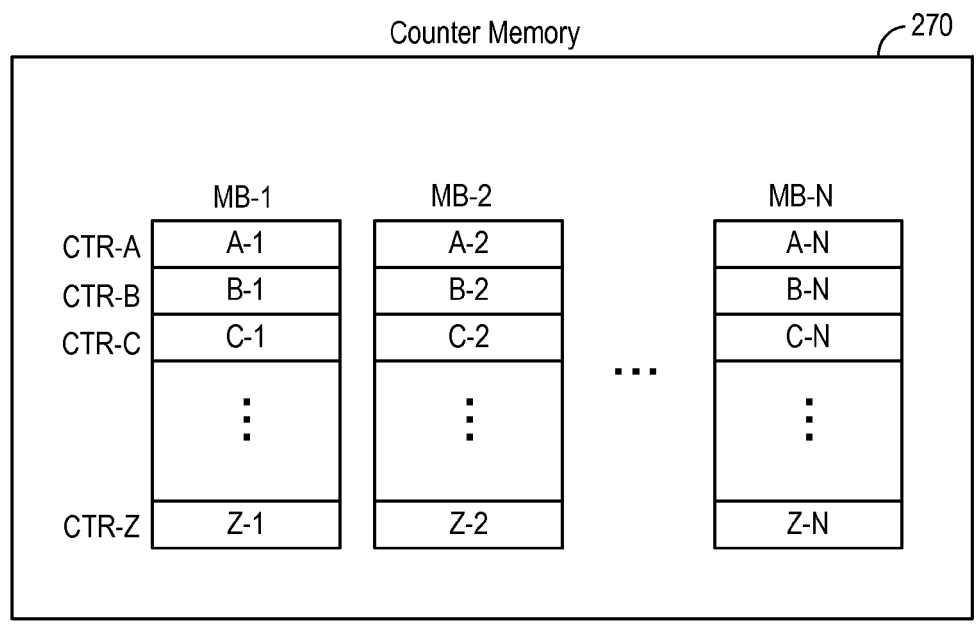
FIG. 4 illustrates an embodiment of a counter memory configured in multiple memory banks for use in a security device for storing event statistics.

FIG. 4 illustrates an embodiment of a counter memory configured in multiple memory banks for use in a security device for storing event statistics. Counter memory 270 may be implemented using a single memory device partitioned into logical blocks as the separate memory banks Counter memory 270 can also be implemented using separate memory devices for the separate memory banks. In some embodiments, counter memory 270 is implemented using one or more high latency memory devices. In the present description, a high latency memory device refers to a memory device with a memory latency greater than the memory update rate required to handle writing of memory data at the data rate of the incoming data packets received by the security device. Thus, when a counter value update is performed to an event counter stored in the memory device, the writing of the new counter value to the memory cell is not completed before the next counter value update must be performed to the same memory device.

In the present embodiment, counter memory 270 includes N memory banks MB-1 to MB-N. An event counter is stored across all memory banks with each memory bank storing partial counter values. Each event counter is indexed by a counter ID. For instance, counter memory 270 is configured to store counter values for event counters A to Z associated with counter ID CTR-A to CTR-Z. For each event counter, such as event counter CTR-A, each memory bank stores partial counter values. Thus, partial counter value A-1 is stored in memory bank MB-1 while partial counter value A-2 is stored in memory bank MB-2, and so on. The sum of all partial counter values A-1 to A-N is the total counter value for the event counter CTR-A. By replicating the event counters and distributing the event counters over several memory banks, the counter memory can be implemented using low cost, high latency memories so that the overall system cost is reduced while the performance of the security system is maintained.

The memory controller 256 implements a counter memory update method where counter values in the counter memory 270 are updated by alternating between different memory banks for each memory update. For instance, when memory controller 256 updates the counter value for an event counter (e.g. CTR-B), memory controller 256 may access the partial counter value for CTR-B in memory bank MB-1 so that the partial counter value B-1 is updated. Then for the next counter value update, which can be for the same event counter or for a different event counter, memory controller 256 will access the partial counter value for that event counter in a memory bank other than memory bank MB-1. The memory controller 256 may access any one of memory banks MB-2 to MB-N. In this manner, the counter update can occur at a faster rate than the memory latency per memory bank of the counter memory. The next counter update may be performed to a next memory bank before the counter update to the first memory bank is completed. That is, the next counter update may be performed during the latency window of the first memory bank. In fact, by alternating the memory updates between N memory banks, the required memory update rate is essentially divided down by the N banks of memory. By using sufficient number of memory banks storing partial counter values, the counter memory may be implemented using high latency memory devices as access to any single memory bank may be deferred until the memory latency window for that signal memory bank expires.

To obtain the counter value for any event counter, the security device aggregates the partial counter values for that event counter stored in all of the memory banks. In normal operation of the security device, the event counter sum is read infrequently, such as once per flow session. For example, when the flow session is being torn down, the event counter sum is read out of the counter memory to store in a log. Thus, the event counter sum is not needed very frequently and the summing operation to obtain the event counter sum does not impact the speed of the security device.

Figure 5:
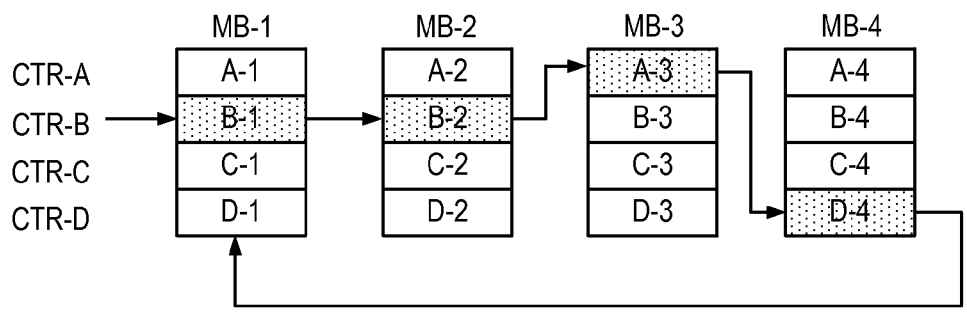
FIG. 5 illustrates examples of the counter memory update operations.

FIG. 5 illustrates examples of the counter memory update operations. In the example shown in FIG. 5, a counter memory includes four memory banks MB-1 to MB-4 storing partial counter values for four event counters CTR-A to CTR-D. At a given point in the operation of the security device, the controller of the security device issues instructions to update the event counter CTR-B. The memory controller selects memory bank MB-1 and the partial counter value B-1 for counter CTR-B is updated. During the latency window of memory bank MB-1, the controller of the security device issues instructions to update the same event counter CTR-B again. The memory controller selects memory bank MB-2 and the partial counter value B-2 for counter CTR-B is updated. The start of the counter update operation for memory bank MB-2 can be within the latency window of the memory bank MB-1. The process continues with the next counter update being performed using a different memory bank. In the next counter update, a different event counter CTR-A is to be updated and the memory controller selects memory bank MB-3 and the partial counter value A-3 is updated. Following that, event counter CTR-D is to be updated and the memory controller selects memory bank MB-4 and partial counter value D-4 is updated. By now, the latency window for memory bank MB-1 has certainly expired and thus, for the next counter update, the memory controller may return to memory bank MB-1.

In the example illustrated in FIG. 5, the memory banks in the counter memory are accessed sequentially. However, a sequential access order is not critical or necessary to the practice of the present invention. When a counter memory configured in multiple memory banks is used, the memory banks can be accessed in any order as long as the same memory bank is not accessed in consecutive counter updates and that the same memory bank is accessed only after the time period of the memory latency has expired. In one embodiment, the memory controller in the controller of the security device applies a marker to identify the memory bank used in the previous update cycle and the memory controller does not select the marked memory bank until the latency window is over.

In embodiments of the present invention, the counter memory can be implemented using a memory device that is scalable. In some embodiments, the memory device is configurable and the counter memory may be configurable to N banks or 2N banks using the same memory device depending on the application.

In embodiments of the present invention, the counter memory can be implemented using an on-chip memory of the controller integrated circuit. In other embodiments, the counter memory is implemented as an off-chip memory to the controller integrated circuit. Furthermore in other embodiments, the counter memory can be implemented as part of a multi-chip module. The exact physical implementation of the counter memory is not critical to the practice of the present invention.

The counter memory update method using a counter memory configured in multiple memory banks is particularly advantageous when a DRAM memory device is used to implement the counter memory. DRAMs inherently access memory cells based on pages. That is, each time a memory cell in a DRAM is updated, a page of DRAM data is read out and stored in register. The retrieved data is updated and the page may remain in the register so that multiple memory cells in the same page can be written. When it is necessary to access another page of DRAM data, the whole page is written back to the DRAM and the next page of data is retrieved and stored in the register. The page read and write back operation in a DRAM—referred to as the page swap operation—leads to long latency in DRAM operations. Because of the page swap latency of DRAM devices, DRAM devices are usually not desirable in applications where the memory cells are accessed in random order so that a first memory update may be made to one page of the DRAM while the next memory update is made to another page. In a security device, because the counter identifiers are randomly assigned to classified flows, the counter memory is typically accessed in a random order as counter updates are made to counter identifiers that are randomly assigned. Thus, when the counter memory is implemented using a DRAM in a conventional manner, a counter update for one counter identifier may be made to one page and then it is very unlikely that the counter update for the next counter identifier is also on the same page. Because of the random nature of the counter updates, a DRAM counter memory must perform a page swap operation for each counter update. The long latency of the DRAM page swap operation prevents DRAMs from being a viable option for use as counter memories in security devices, prior to the present invention.

In embodiments of the present invention, the counter memory 270 is implemented using a DRAM memory device. The DRAM memory device is configured into N logical blocks to implement the N memory banks. When the counter memory is a DRAM, the counter memory update method is configured to initiate a precharge after each counter update is completed so that the current page is written back to the memory bank and the memory bank is ready to access another page for another counter update. More specifically, when the counter memory receives instructions to update a counter value, a memory bank is accessed and a page of memory data associated with the event counter is read out to a register. The relevant counter value is updated. The memory controller then initiates a precharge which will cause the page of memory data stored in the register to be written back to the memory bank. The memory bank is then ready to be accessed again. During this latency window, the memory controller uses another memory bank to update counter values so that counter value updates can be performed at the required data rate while the counter memory itself has a high memory latency or a slow memory update rate. The latency of the memory banks does not affect the update rate of the counter memory as different memory banks are used for each counter value update.

Figure 6:
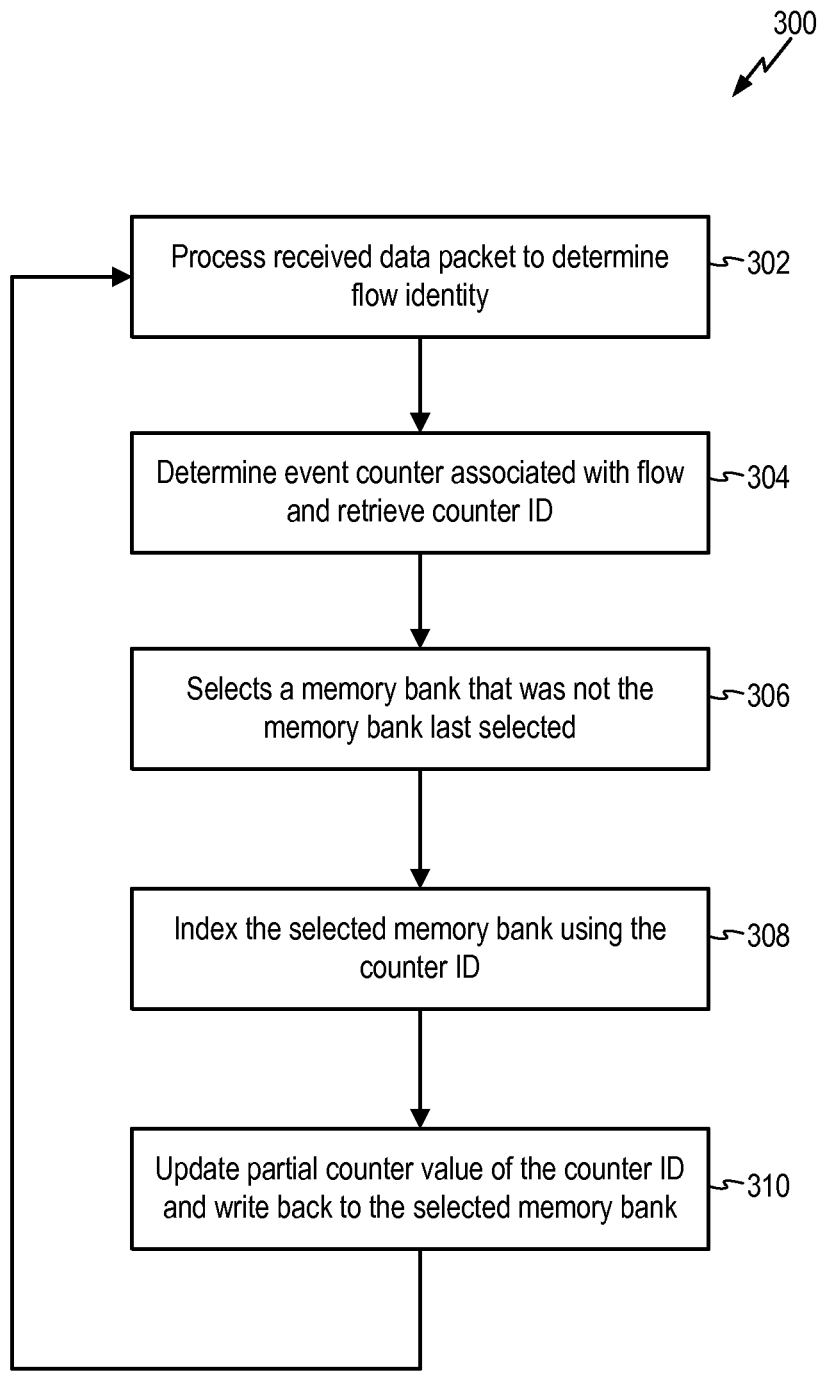
FIG. 6 is a flow chart illustrating the counter memory update method in examples of the present invention.

FIG. 6 is a flow chart illustrating the counter memory update method in examples of the present invention. The counter memory update method 300 is implemented in a security device to keep track of event statistics associated with the incoming data packets. The event statistics are stored in a counter memory configured with multiple memory banks, each memory bank storing partial counter values for one or more event counters. At 302, a received data packet is processed to determine the flow identity associated with the received data packet. For instance, the flow identity can be identified from the 5-tuple information of the data packet. At 304, an event counter (e.g. counter A) associated with the identified flow is retrieved and the counter ID (e.g. CTR-A) associated with the identified event counter is obtained. The counter ID may be provided to a memory controller. At 306, a memory bank is selected from the multiple memory banks. The selected memory bank is one that was not the memory bank last selected. At 308, the counter ID is used to index the selected memory bank to retrieve the stored partial counter value for the event counter. At 310, the partial counter value associated with the counter ID in the selected memory bank is updated. The partial counter value may be incremented, decremented or set to a given value. The updated partial counter value is written back to the selected memory bank to be stored in the counter memory. The method returns to 302 where the next received data packet is processed. Accordingly, each time the memory controller selects a memory bank, a memory bank that was not the last one used is selected. In this manner, memory latency associated with the memory banks do not prevent the counter memory from being updated at a high refresh rate.

In one embodiment, the counter memory update method update the partial counter value associated with a counter ID in a first memory bank. Then, the method updates the partial counter value associated with the same or a different counter ID in a second memory bank, where the update to the second memory bank is performed within a latency window of the first memory bank.

In one embodiment, each memory bank stores partial counter values for an event counter and a total count value for an event counter is obtained by reading the partial counter values from all memory banks and summing the partial counter values from the memory banks. In one embodiment, the total count value of an event counter is read out when the flow is completed, such as when the flow is to be torn down.

In one embodiment, the event statistics include information associated with a flow associated with received data packets. The event statistics can include information such as the number of data packets or the number of data bytes.

In one embodiment, the memory controller selects a next memory bank in a deterministic manner. For example, the memory banks may be selected in sequence. In another embodiment, the selection of the next memory bank is configurable. For example, the memory banks may be selected in a random order. The memory bank last used may be marked by a marker so that the memory bank will not be selected for the next counter value update.

In some embodiments of the present invention, one or more of the memory banks may experience a counter overflow condition when a counter value update to a counter ID leads to a counter value exceeding the maximum value that can be stored in that memory bank for that counter ID. When an overflow condition occurs, the partial counter value for that counter ID in that memory bank is exported to be stored in an external device outside of the counter memory. The residual count value (the count value above the maximum) may be written back to the memory bank and the counter memory update method continues.

In the above-described embodiments, the counter memory update method is implemented in a security device for keep track of event statistics for security policy enforcement. In other embodiments of the present invention, the counter memory update method may be applied to other devices or systems for keeping track of system statistics, such as system resource usage. For instance, a system may maintain a set of counters to keep track of system statistics. The counters may be implemented in a counter memory configured in the same manner described above for storing counter values to allow the counters to be updated at a high rate while using low cost memories. In some embodiments, the system statistics are stored in a counter memory with multiple memory banks. The system memory controller implements a counter memory update method similar to the method described above where the system memory controller receives instructions to update counters relating to system statistics and the counter values in the counter memory are updated by alternating between different memory banks for each memory update.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A security device, comprising:
   a controller configured to receive incoming data packets and to determine a flow identifier associated with a received data packet, the controller further determining an event counter associated with the flow and providing a counter identifier to a memory controller; and
   a counter memory comprising a plurality of memory banks, each memory bank storing a partial counter value for one or more event counters, the counter memory being in communication with the memory controller and indexed by the counter identifier,
   wherein the memory controller marks the memory bank last selected and, in response to the memory controller receiving the counter identifier from the controller, the memory controller selects for access a single memory bank in the counter memory that was not marked as the memory bank last selected, the memory controller accessing the plurality of memory banks in the counter memory in any order with the same memory bank not being selected for access in consecutive counter updates, and the memory controller retrieves the partial counter value associated with only one counter identifier in the selected memory bank and the memory controller updates the partial counter value, the updated partial counter value being written back to the selected memory bank; and
   wherein the memory controller selects a first memory bank to update the partial counter value for a first counter identifier and marks the first memory bank, and the memory controller next selects a second memory bank not marked to update a partial counter value, the memory controller is configured to select a second counter identifier different from the first counter identifier to update the partial counter value in the second memory bank during the latency window of the update of the partial counter value of the first counter identifier.

2. The security device of claim 1, wherein the partial counter value associated with the counter identifier in the selected memory bank is updated by being incremented, decremented, or set to a given value.

3. The security device of claim 1, wherein the memory controller reads out the partial counter values associated with an event counter from all the memory banks, the partial counter values being summed to generate a total count value for the event counter.

4. The security device of claim 1, wherein the memory controller selects the memory banks in a sequential order or in a random order.

5. The security device of claim 1, wherein the plurality of memory banks comprise logical partitions of a single memory device.

6. The security device of claim 1, wherein the plurality of memory banks comprise separate memory devices.

7. The security device of claim 1, wherein the counter memory comprises a DRAM device.

8. The security device of claim 7, wherein the memory controller initiates a precharge operation after the counter value is updated to write the updated counter value back to the selected memory bank.

9. The security device of claim 1, wherein the controller is configured to determine if a received data packet belongs to a known flow or an unknown flow, the controller retrieves a flow identifier for a received data packet associated with a known flow and creates a flow identifier for a received data packet associated with an unknown flow.

10. A method in a security device comprising a counter memory configured to store event statistics associated with received data packets, the method comprising:
   processing a received data packet to determine a flow identity;
   determining an event counter associated with the identified flow;
   retrieving a counter identifier associated with the event counter;
   selecting a memory bank in the counter memory comprising a plurality of memory banks, wherein selecting the memory bank in the counter memory comprises marking the memory bank last selected and selecting a memory bank that was not marked as the memory bank last selected;
   indexing the selected memory bank using the counter identifier;
   updating a counter value stored in the selected memory bank, the counter value being a partial counter value for the event counter; and
   writing the updated counter value back to the selected memory bank,
   wherein selecting the memory bank in the counter memory comprises:
   marking the memory bank last selected; and
   in response to the memory controller receiving the counter identifier from the controller, selecting for access a single memory bank that was not marked as the memory bank last selected, the plurality of memory banks in the counter memory being selected or access in any order with the same memory bank not being selected for access in consecutive counter updates; and
   wherein selecting the memory bank in the counter memory further comprises:
   selecting a first memory bank to update only one partial counter value for a first counter identifier;
   marking the first memory bank; and
   selecting a second memory bank not marked to update a partial counter value, the memory controller is configured to select a second counter identifier different from the first counter identifier to update the partial counter value in the second memory bank during the latency window of the update of the partial counter value of the first counter identifier.

11. The method of claim 10, wherein updating a counter value stored in the selected memory bank comprises incrementing the counter value, decrementing the counter value, or setting the counter value to a given value.

12. The method of claim 10, further comprising:
   reading out the partial counter values stored in the plurality of memory banks associated with a counter identifier; and
   summing the partial counter values to generate a total count value for the event counter associated with the counter identifier.

13. The method of claim 10, wherein selecting a memory bank in the counter memory comprises selecting the memory banks in a sequential order or in a random order.

14. The method of claim 10, wherein the plurality of memory banks comprise logical partitions of a single memory device.

15. The method of claim 10, wherein the plurality of memory banks comprise separate memory devices.

16. The method of claim 10, wherein the counter memory comprises a DRAM device.

17. The method of claim 16, further comprising:
   initiating a precharge operation after the counter value is updated to write the updated counter value back to the selected memory bank.

18. The method of claim 10, wherein processing a received data packet to determine a flow identity comprises:
   processing the received data packet to determine if a received data packet belongs to a known flow or an unknown flow;
   retrieving a flow identifier for a received data packet associated with a known flow; and
   creating a flow identifier for a received data packet associated with an unknown flow.

19. A system, comprising:
   a processor configured to:
   process a received data packet to determine a flow identity;
   determine an event counter associated with the identified flow;
   retrieve a counter identifier associated with the event counter;
   select a memory bank in a counter memory comprising a plurality of memory banks, wherein selecting the memory bank in the counter memory comprises marking the memory bank last selected and, in response to the memory controller receiving the counter identifier from the controller, selecting for access a single memory bank that was not marked as the memory bank last selected, the plurality of memory banks in the counter memory being selected or access in any order with the same memory bank not being selected for access in consecutive counter updates;
   index the selected memory bank using the counter identifier;
   update a counter value stored in the selected memory bank, the counter value being a partial counter value for the event counter; and
   write the updated counter value back to the selected memory bank,
   wherein the processor is further configured to:
   select a first memory bank to update only one partial counter value for a first counter identifier;
   mark the first memory bank; and
   select a second memory bank not marked to update a partial counter value, the memory controller is configured to select a second counter identifier different from the first counter identifier to update the partial counter value in the second memory bank during the latency window of the update of the partial counter value of the first counter identifier; and
   a memory coupled to the processor and configured to provide the processor with instructions.

20. The security device of claim 1, wherein in response to the memory controller determining that updating the partial counter value associated with the counter identifier stored in the selected memory bank results in a counter value that exceeds a maximum value that can be stored in the selected memory bank for that counter identifier, the memory controller exports the partial counter value associated with the counter identifier stored in the selected memory bank to a device external to the counter memory.

21. The method of claim 10, further comprising:
in response to determining that updating the partial counter value associated with the counter identifier stored in the selected memory bank results in a counter value that exceeds a maximum value that can be stored in the selected memory bank for that counter identifier, exporting the partial counter value associated with the counter identifier stored in the selected memory bank to a device external to the counter memory.

* * * * *